United States Patent
Kajiyama et al.

(10) Patent No.: US 7,858,496 B2
(45) Date of Patent: Dec. 28, 2010

(54) WAFER PROCESSING METHOD

(75) Inventors: Keiichi Kajiyama, Ota-ku (JP); Azumi Kondo, Ota-ku (JP)

(73) Assignee: Disco Corporation, Tokyo (JP)

( * ) Notice: Subject to any disclaimer, the term of this patent is extended or adjusted under 35 U.S.C. 154(b) by 8 days.

(21) Appl. No.: 12/542,270

(22) Filed: Aug. 17, 2009

(65) Prior Publication Data
US 2010/0055877 A1  Mar. 4, 2010

(30) Foreign Application Priority Data
Sep. 4, 2008  (JP) .............................. 2008-227157

(51) Int. Cl.
H01L 21/00 (2006.01)
(52) U.S. Cl. ...................... 438/462; 438/460
(58) Field of Classification Search ................ 438/460, 438/462, 464; 257/E21.599
See application file for complete search history.

(56) References Cited
U.S. PATENT DOCUMENTS
2005/0260829 A1 * 11/2005 Uematsu et al. ............. 438/460
2006/0166466 A1 * 7/2006 Maki et al. .................. 438/464

FOREIGN PATENT DOCUMENTS
JP  A 2007-19461  1/2007

* cited by examiner

Primary Examiner—Bradley K Smith
(74) Attorney, Agent, or Firm—Greer, Burns & Crain, Ltd.

(57) ABSTRACT

Disclosed herein is a wafer processing method for dividing a wafer along a plurality of streets. The wafer processing method includes a back grinding step of grinding the back side of the wafer in an area corresponding to a device area to thereby reduce the thickness of the device area to a predetermined finished thickness and to simultaneously form an annular reinforcing portion on the back side of the wafer in an area corresponding to a peripheral marginal area, a wafer supporting step of attaching the back side of the wafer to a dicing tape, a kerf forming step of cutting the front side of the wafer along each street to thereby form a kerf having a depth corresponding to the thickness of the device area along each street, thereby dividing the device area into individual devices, and a peripheral marginal area removing step of peeling off the peripheral marginal area from the dicing tape.

4 Claims, 17 Drawing Sheets

WAFER PROCESSING METHOD

BACKGROUND OF THE INVENTION

1. Field of the Invention

The present invention relates to a wafer processing method for dividing a wafer along a plurality of crossing streets formed on the front side of the wafer, the wafer having a device area and a peripheral marginal area surrounding the device area, the device area being composed of a plurality of regions partitioned by the streets, wherein individual devices are respectively formed in the regions of the device area.

2. Description of the Related Art

In a semiconductor device fabrication process, a plurality of crossing division lines called streets are formed on the front side of a substantially disk-shaped semiconductor wafer to thereby partition a plurality of regions where devices such as ICs and LSIs are respectively formed. The semiconductor wafer is cut along these streets to thereby divide a device area into the individual devices. Prior to cutting the wafer along the streets, the back side of the wafer is ground or etched to reduce the thickness of the wafer to a predetermined finished thickness. In recent years, it has been required to reduce the wafer thickness to 50 μm or less in order to achieve a reduction in size and weight of electric equipment. However, such a reduction in wafer thickness to 50 μm or less causes easy damage to the wafer, so that handling such as transportation of the wafer is difficult.

To solve this problem, there has been disclosed a wafer processing method in Japanese Patent Laid-Open No. 2007-19461, for example. In this wafer processing method, the back side of a wafer is ground in an area corresponding to a device area to thereby reduce the thickness of the device area to a predetermined finished thickness and to simultaneously form an annular reinforcing portion in an area corresponding to a peripheral marginal area surrounding the device area, thereby increasing the rigidity of the wafer.

After grinding the back side of the wafer in the area corresponding to the device area to thereby reduce the thickness of the device area to a predetermined finished thickness and to simultaneously form the annular reinforcing portion in the area corresponding to the peripheral marginal area, the wafer is divided into the individual devices. In dividing the wafer into the individual devices, there is a problem such that when and how to remove the peripheral marginal area where the annular reinforcing portion is formed.

SUMMARY OF THE INVENTION

It is therefore an object of the present invention to provide a wafer processing method which can reliably remove the peripheral marginal area where the annular reinforcing portion is formed to divide the wafer into the individual devices and can pick up each device from the dicing tape without the influence of the peripheral marginal area.

In accordance with an aspect of the present invention, there is provided a wafer processing method for dividing a wafer along a plurality of crossing streets formed on the front side of the wafer, the wafer having a device area and a peripheral marginal area surrounding the device area, the device area being composed of a plurality of regions partitioned by the streets, wherein individual devices are respectively formed in the regions of the device area. The wafer processing method includes: a back grinding step of grinding the back side of the wafer in an area corresponding to the device area to thereby reduce the thickness of the device area to a predetermined finished thickness and to simultaneously form an annular reinforcing portion on the back side of the wafer in an area corresponding to the peripheral marginal area; a wafer supporting step of attaching the back side of the wafer to a dicing tape supported to an annular frame after performing the back grinding step, wherein the adhesive force of the dicing tape can be reduced by an external stimulus; a kerf forming step of cutting the front side of the wafer attached to the dicing tape along each street by using a cutting blade after performing the wafer supporting step, thereby forming a kerf having a depth corresponding to the thickness of the device area along each street to thereby divide the device area into the individual devices; and a peripheral marginal area removing step of applying the external stimulus to the dicing tape at which attached the peripheral marginal area where the annular reinforcing portion is formed after performing the kerf forming step, thereby reducing the adhesive force of the dicing tape, and next peeling off the peripheral marginal area from the dicing tape.

Preferably, the wafer processing method further includes a pickup step of expanding the dicing tape after performing the peripheral marginal area removing step to thereby increase the spacing between any adjacent ones of the individual devices divided from each other and attached to the dicing tape, and next peeling off each device from the dicing tape.

In accordance with another aspect of the present invention, there is provided a wafer processing method for dividing a wafer along a plurality of crossing streets formed on the front side of the wafer, the wafer having a device area and a peripheral marginal area surrounding the device area, the device area being composed of a plurality of regions partitioned by the streets, wherein individual devices are respectively formed in the regions of the device area. The wafer processing method includes: a back grinding step of grinding the back side of the wafer in an area corresponding to the device area to thereby reduce the thickness of the device area to a predetermined finished thickness and to simultaneously form an annular reinforcing portion on the back side of the wafer in an area corresponding to the peripheral marginal area; a wafer supporting step of attaching the back side of the wafer to a dicing tape supported to an annular frame after performing the back grinding step, wherein the adhesive force of the dicing tape can be reduced by an external stimulus; a peripheral marginal area separating step of cutting the wafer attached to the dicing tape along the boundary between the device area and the peripheral marginal area after performing the wafer supporting step; a peripheral marginal area removing step of applying the external stimulus to the dicing tape at which attached the peripheral marginal area where an annular reinforcing portion is formed after performing the peripheral marginal area separating step, thereby reducing the adhesive force of the dicing tape, and next peeling off the peripheral marginal area from the dicing tape; and a kerf forming step of cutting the front side of the device area of the wafer along each street by using a cutting blade after performing the peripheral marginal area removing step, thereby forming a kerf having a depth corresponding to the thickness of the device area along each street to thereby divide the device area into the individual devices.

Preferably, the wafer processing method further includes a pickup step of expanding the dicing tape after performing the kerf forming step to thereby increase the spacing between any adjacent ones of the individual devices divided from each other and attached to the dicing tape, and next peeling off each device from the dicing tape.

According to the present invention, the device area can be reliably divided into the individual devices, and each device can be picked up from the dicing tape without the influence of the peripheral marginal area. Further, the kerf forming step of dividing the device area into the individual devices can be easily performed, and each device can be picked up from the dicing tape without the influence of the peripheral marginal area.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
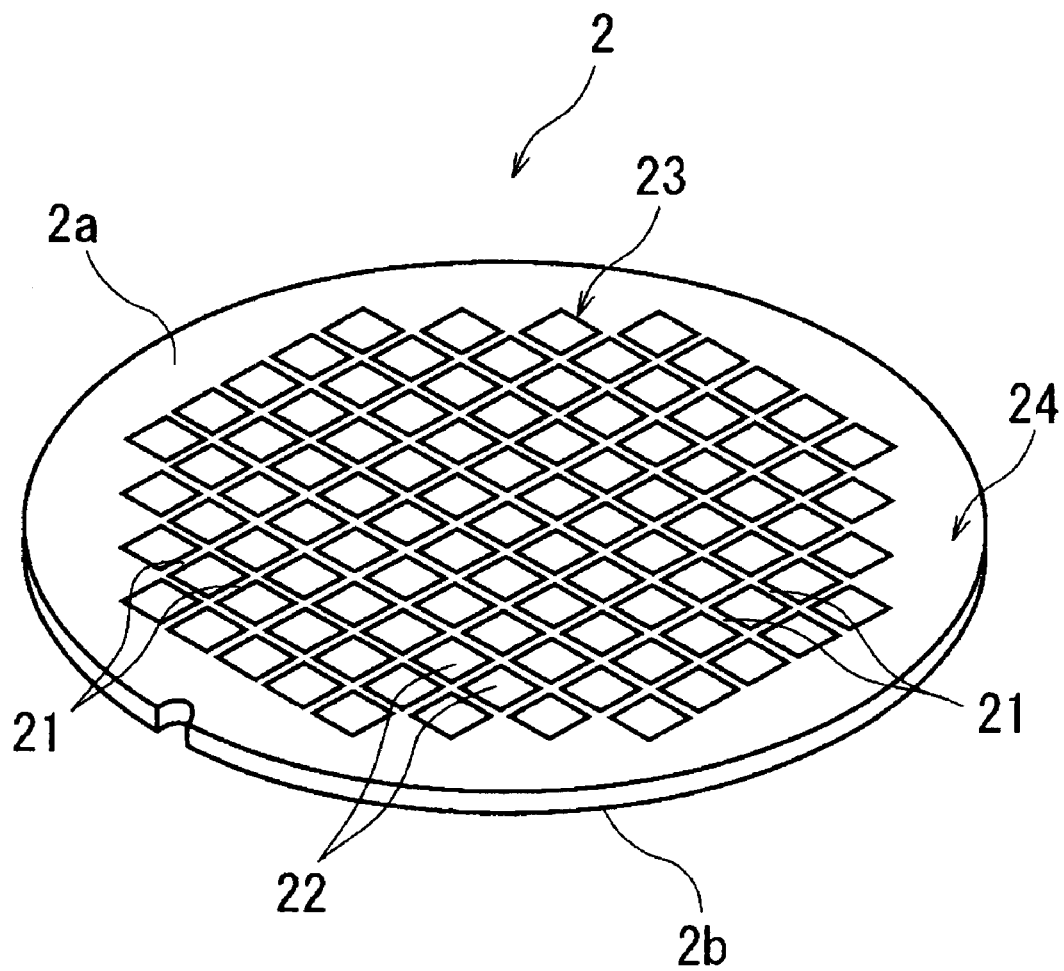
FIG. 1 is a perspective view of a semiconductor wafer as a wafer to be divided into individual devices by the wafer processing method according to the present invention.

Some preferred embodiments of the wafer processing method according to the present invention will now be described in detail with reference to the attached drawings. FIG. 1 is a perspective view of a semiconductor wafer 2 as a wafer to be divided into individual devices by the wafer processing method according to the present invention. The semiconductor wafer 2 shown in FIG. 1 is a silicon wafer having a thickness of 700 µm, for example. The semiconductor wafer 2 has a front side 2a and a back side 2b. A plurality of crossing streets 21 are formed on the front side 2a of the semiconductor wafer 2 to thereby partition a plurality of rectangular regions where a plurality of devices 22 such as ICs and LSIs are respectively formed. The semiconductor wafer 2 includes a device area 23 where the devices 22 are formed and a peripheral marginal area 24 surrounding the device area 23.

Figure 2:
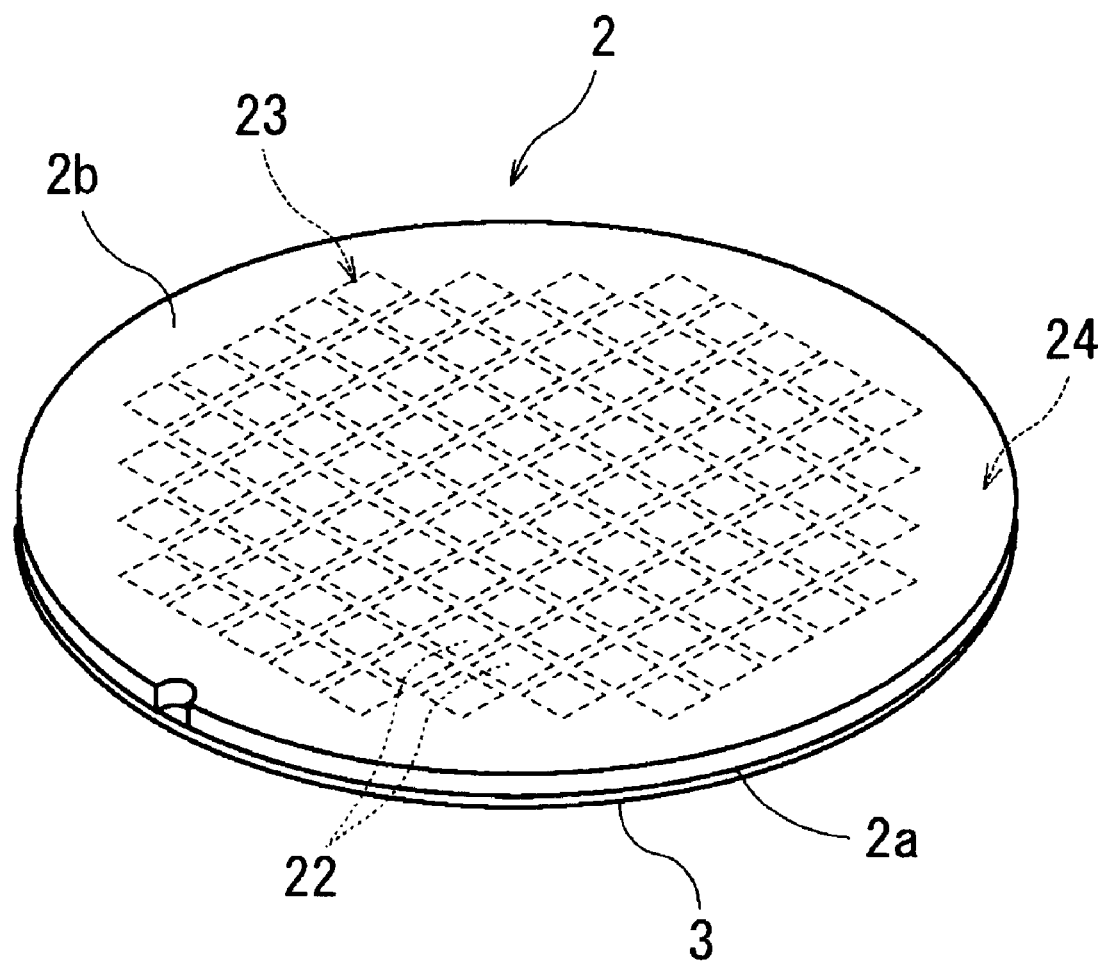
FIG. 2 is a perspective view of the semiconductor wafer shown in FIG. 1 in the condition where a protective member is attached to the front side of the semiconductor wafer.

Prior to cutting the semiconductor wafer 2 along the streets 21 to divide it into the individual devices 22, the back side 2b of the semiconductor wafer 2 is ground in an area corresponding to the device area 23 to thereby reduce the thickness of the device area 23 to a predetermined finished thickness and to simultaneously form an annular reinforcing portion on the back side 2b of the semiconductor wafer 2 in an area corresponding to the peripheral marginal area 24. Prior to grinding the back side 2b of the semiconductor wafer 2, a protective member 3 for protecting the devices 22 is attached to the front side 2a of the semiconductor wafer 2 as shown in FIG. 2 (protective member attaching step). Accordingly, the back side 2b of the semiconductor wafer 2 is exposed as shown in FIG. 2.

There will now be described a first preferred embodiment of the wafer processing method for dividing the semiconductor wafer 2 into the individual devices 22 after performing the protective member attaching step mentioned above. In the first preferred embodiment, a back grinding step is first performed in the following manner. The back side 2b of the semiconductor wafer 2 is ground in an area corresponding to the device area 23 to reduce the thickness of the device area 23 to a predetermined finished thickness and to simultaneously leave an area corresponding to the peripheral marginal area 24 as an annular reinforcing portion. This back grinding step is performed by using a grinding apparatus 4 shown in FIG. 3.

Figure 3:
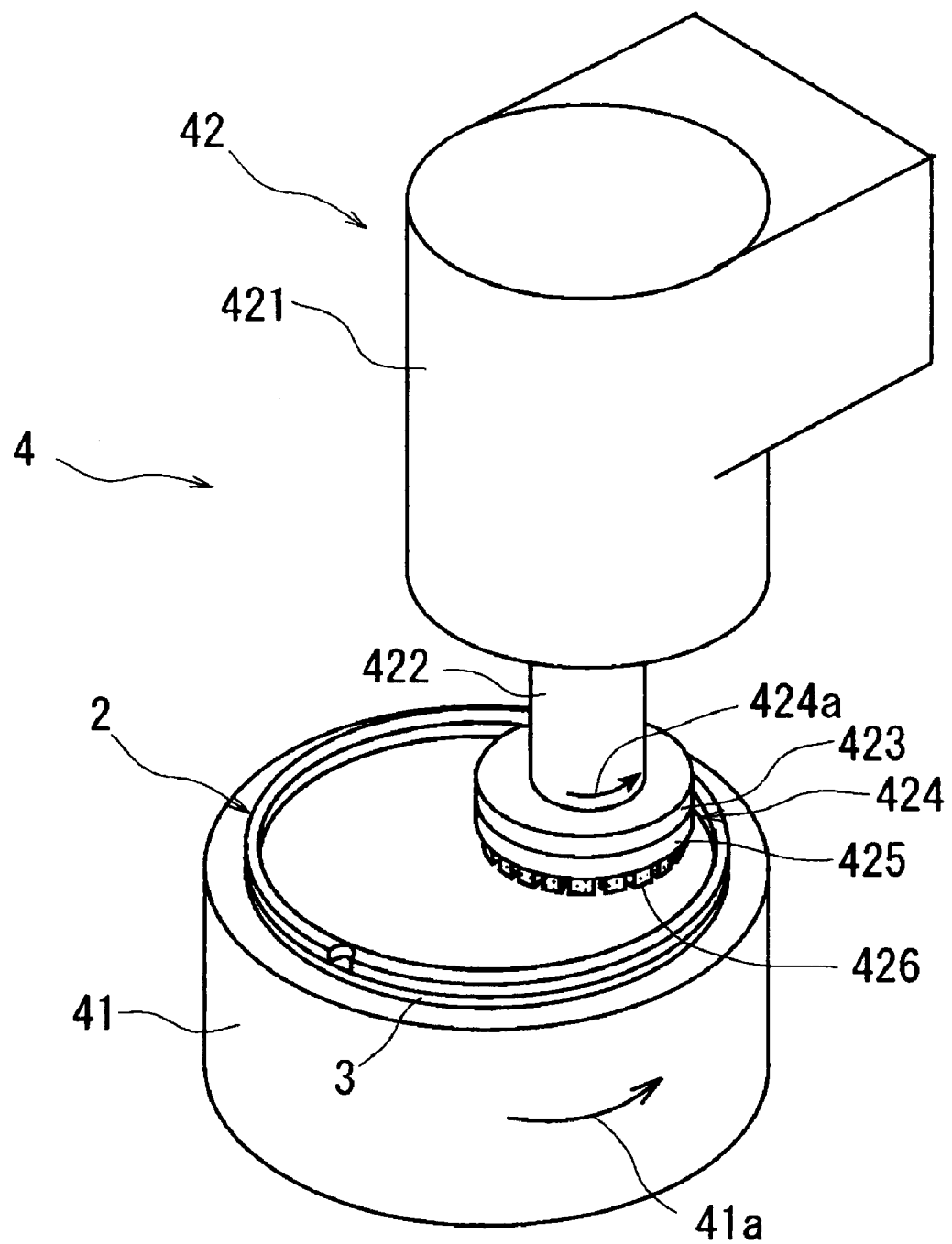
FIG. 3 is a perspective view of a grinding apparatus for performing a back grinding step in the wafer processing method according to the present invention.

The grinding apparatus 4 shown in FIG. 3 includes a chuck table 41 for holding the semiconductor wafer 2 and grinding means 42 for grinding the back side 2b of the semiconductor wafer 2 held on the chuck table 41. The chuck table 41 has an upper surface as a holding surface for holding the semiconductor wafer 2 under suction and is rotatable in the direction shown by an arrow 41a in FIG. 3. The grinding means 42 includes a spindle housing 421, a rotating spindle 422 rotatably supported to the spindle housing 421 so as to be rotated by a rotational driving mechanism (not shown), a mounter 423 mounted on the lower end of the rotating spindle 422, and a grinding wheel 424 mounted on the lower surface of the mounter 423. The grinding wheel 424 is composed of a disk-shaped base 425 and an abrasive ring 426 fixed to the lower surface of the base 425. The abrasive ring 426 is composed of a plurality of abrasive members annularly arranged at given intervals along the outer circumference of the base 425. The base 425 is mounted on the lower surface of the mounter 423.

Figure 4:
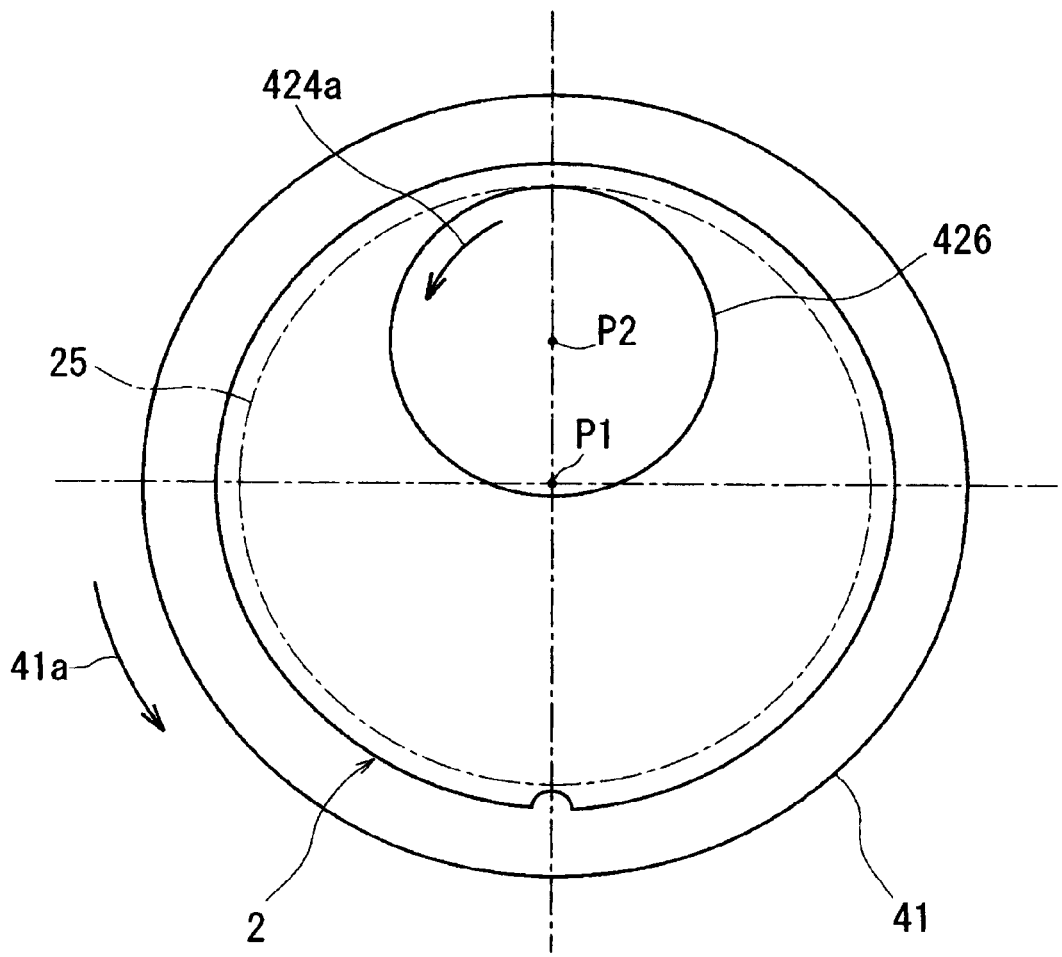
FIG. 4 is a schematic plan view for illustrating the back grinding step in the wafer processing method according to the present invention.

The back grinding step using the grinding apparatus 4 is performed in the following manner. The semiconductor wafer 2 with the protective member 3 is transported to the upper surface (holding surface) of the chuck table 41 by wafer transporting means (not shown). The semiconductor wafer 2 with the protective member 3 is held on the chuck table 41 in the condition where the protective member 3 attached to the front side 2a of the semiconductor wafer 2 is placed on the upper surface (holding surface) of the chuck table 41. The relation between the semiconductor wafer 2 held on the chuck table 41 and the abrasive ring 426 of the grinding wheel 424 will now be described with reference to FIG. 4. The center P1 of rotation of the chuck table 41 and the center P2 of rotation of the abrasive ring 426 (i.e., the grinding wheel 424) are deviated from each other as shown in FIG. 4. Further, the outer diameter of the abrasive ring 426 is set smaller than the diameter of a boundary circle 25 between the device area 23 and the peripheral marginal area 24 of the semiconductor wafer 2 and slightly larger than the radius of the boundary circle 25. Accordingly, the abrasive ring 426 passes through the center P1 of rotation of the chuck table 41, i.e., the center of the semiconductor wafer 2.

Figure 5:
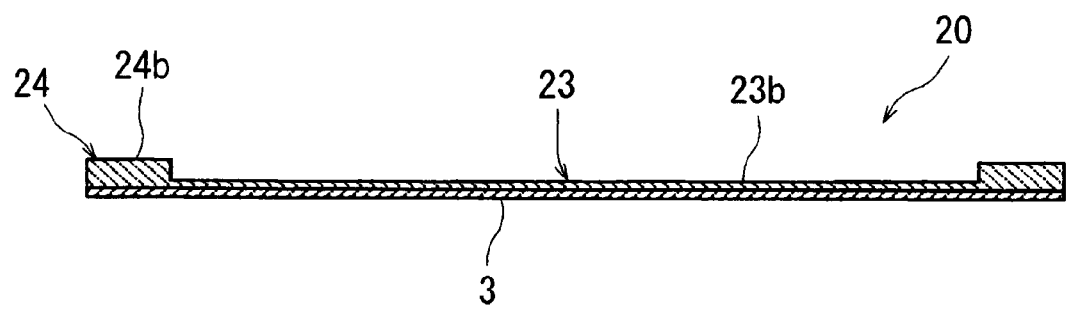
FIG. 5 is a sectional view of the semiconductor wafer formed by performing the back grinding step shown in FIG. 4.

As shown in FIGS. 3 and 4, the chuck table 41 is rotated at 300 rpm, for example, in the direction shown by the arrow 41a, and the grinding wheel 424 is rotated at 6000 rpm, for example, in the direction shown by an arrow 424a. At the same time, a feed mechanism (not shown) is operated to lower the grinding wheel 424 until the abrasive ring 426 comes into contact with the back side 2b of the semiconductor wafer 2. Thereafter, the grinding wheel 424 is fed downward by a predetermined amount at a predetermined feed rate. As a result, the back side 2b of the semiconductor wafer 2 is ground in an area corresponding to the device area 23 to form a circular recess 23b having a predetermined depth as shown in FIG. 5. That is, the thickness of the semiconductor wafer 2 is reduced in only the device area 23 to a predetermined thickness (e.g., 30 μm). At the same time, an annular reinforcing portion 24b is formed as a remaining portion having a thickness of 670 μm in this preferred embodiment in an area corresponding to the peripheral marginal area 24 so as to surround the circular recess 23b as shown in FIG. 5 (back grinding step).

Figure 6A:
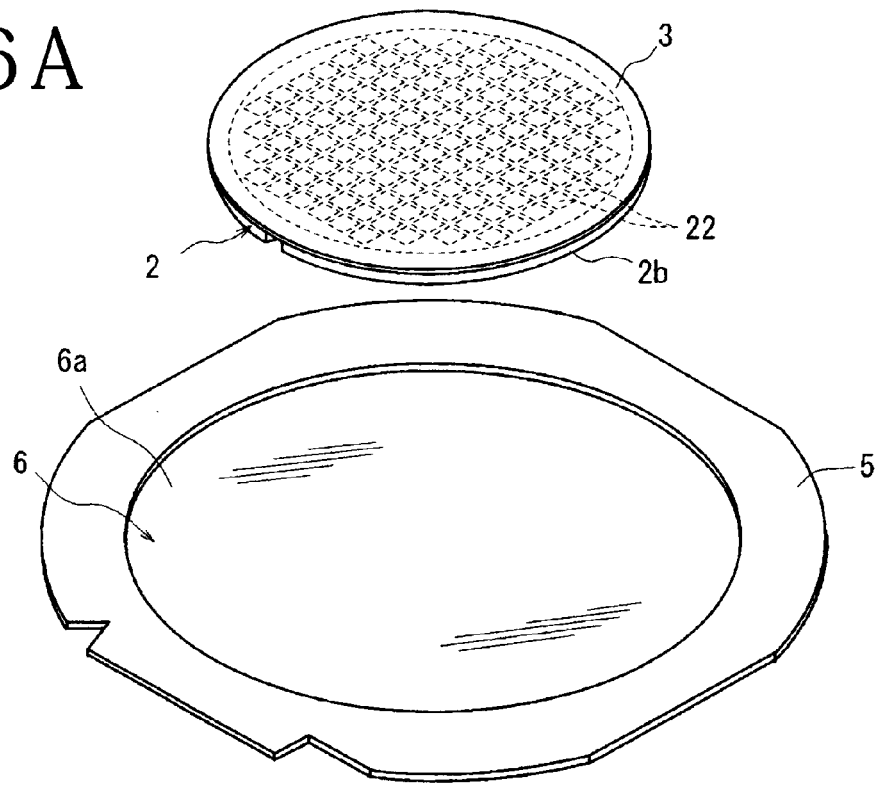
FIGS. 6A and 6B are perspective views for illustrating a wafer supporting step in the wafer processing method according to the present invention.
Figure 6B:
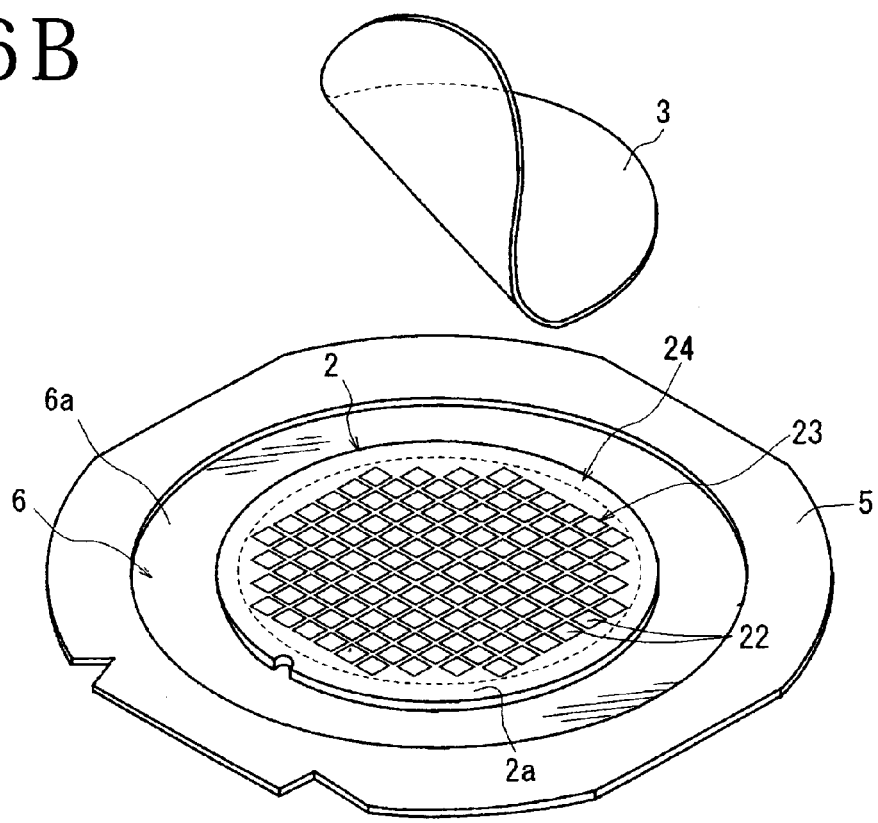

After performing the back grinding step, a wafer supporting step is performed in such a manner that the back side 2b of the semiconductor wafer 2 is attached to a dicing tape supported to an annular frame, wherein the adhesive force of the dicing tape can be reduced by an external stimulus. As shown in FIG. 6A, a dicing tape 6 is supported at its outer circumferential portion to an annular frame 5 so as to close the opening of the annular frame 5. The dicing tape 6 is formed from a sheet of synthetic resin such as polyolefin. In this preferred embodiment, the front side 6a (upper surface) of the dicing tape 6 is coated with an adhesive material having such a property that it is cured by applying ultraviolet radiation, causing a reduction in adhesive force. For example, UC series manufactured and marketed by Furukawa Kogyo Corp. may be used as such a dicing tape whose adhesive force is reduced by applying ultraviolet radiation. As a modification, a tape whose adhesive force is reduced by heating may be used as the dicing tape whose adhesive force is reduced by an external stimulus. For example, Livalpha (registered trademark) manufactured and marketed by Nitto Denko Corp. may be used as the tape whose adhesive force is reduced by heating. The back side 2b of the semiconductor wafer 2 is attached to the front side 6a (upper surface) of the dicing tape 6. Accordingly, the front side 2a of the semiconductor wafer 2 attached to the front side 6a of the dicing tape 6 is oriented upward as shown in FIG. 6B. Thereafter, the protective member 3 is peeled off from the front side 2a of the semiconductor wafer 2 as shown in FIG. 6B.

Figure 7:
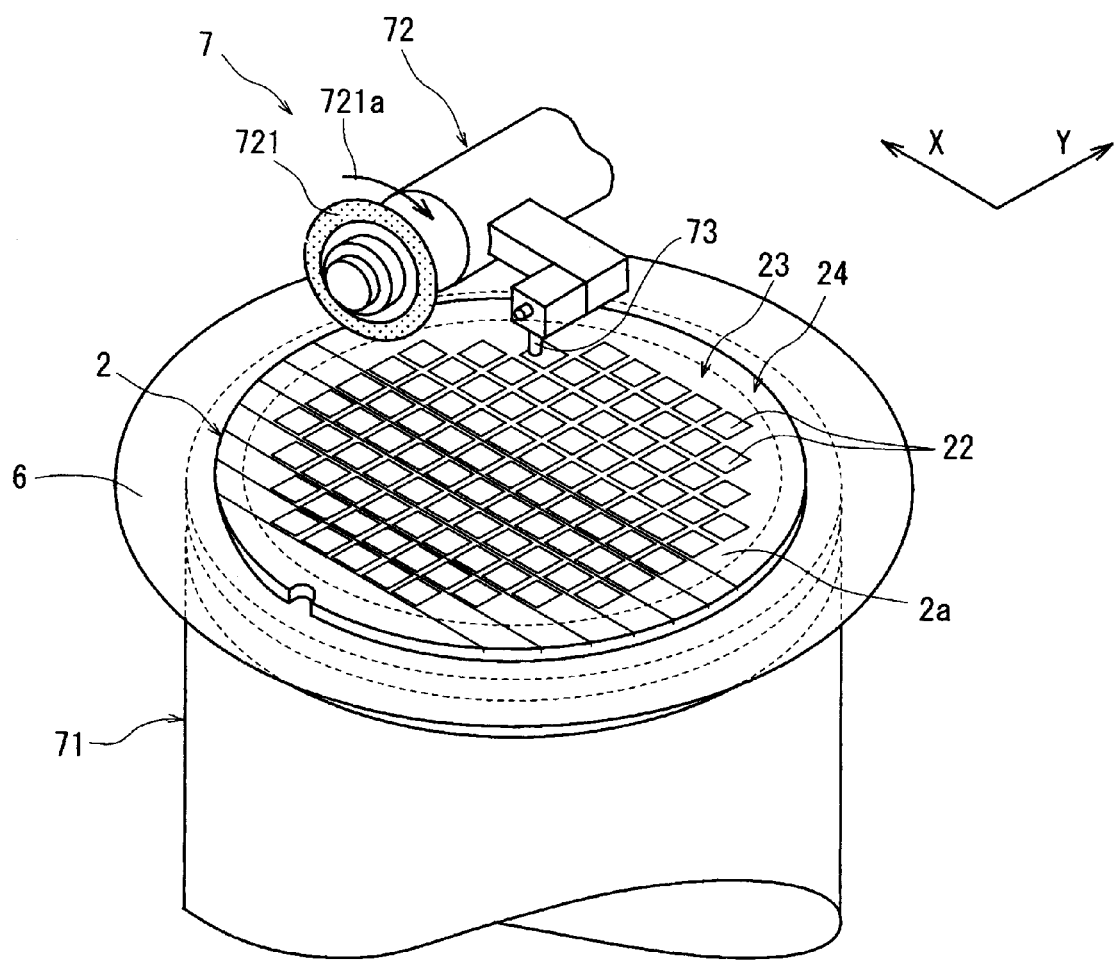
FIG. 7 is a perspective view of a cutting apparatus for performing a kerf forming step in the wafer processing method according to the present invention.

After performing the wafer supporting step mentioned above, a kerf forming step is performed in such a manner that the front side 2a of the semiconductor wafer 2 attached to the dicing tape 6 is cut along each street 21 by using a cutting blade to thereby form a kerf having a depth corresponding to the thickness of the device area 23. This kerf forming step is performed by using a cutting apparatus 7 shown in FIG. 7. The cutting apparatus 7 shown in FIG. 7 includes a chuck table 71 for holding the semiconductor wafer 2, cutting means 72 having a cutting blade 721, and imaging means 73. The chuck table 71 is so configured as to hold the semiconductor wafer 2 under suction. The chuck table 71 is movable in a feeding direction shown by an arrow X in FIG. 7 by feeding means (not shown) and also movable in an indexing direction shown by an arrow Y in FIG. 7 by indexing means (not shown).

Figure 8A:
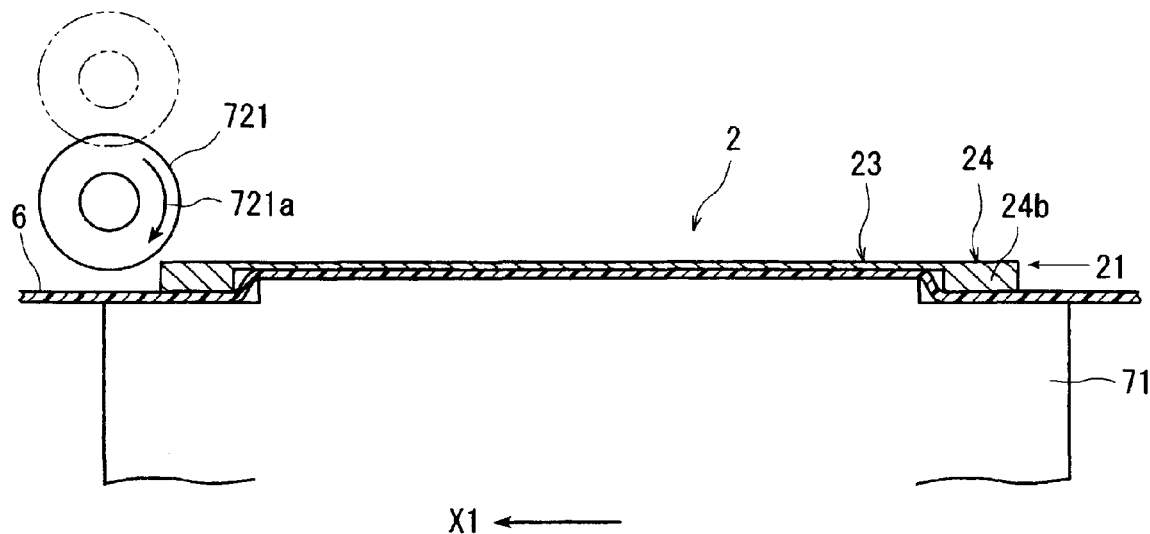
FIGS. 8A and 8B are sectional views for illustrating the kerf forming step in the wafer processing method according to the present invention.
Figure 8B:
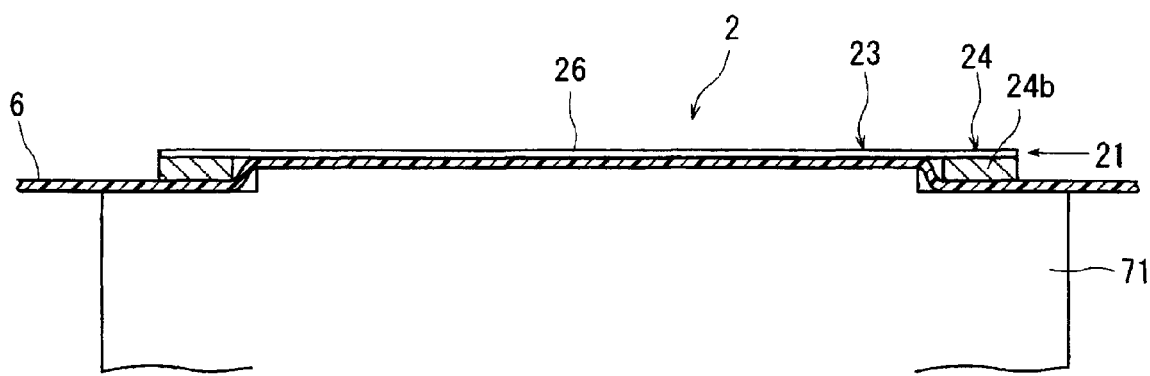

As shown in FIGS. 8A and 8B, the upper surface of the chuck table 71 is formed with a raised portion adapted to engage with the circular recess 23b formed on the back side 2b of the semiconductor wafer 2. The kerf forming step using the cutting apparatus 7 is performed in the following manner. The semiconductor wafer 2 is placed on the chuck table 71 in the condition where the dicing tape 6 to which the back side 2b of the semiconductor wafer 2 is attached comes into contact with the upper surface of the chuck table 71. By operating suction means (not shown), the semiconductor wafer 2 is held on the chuck table 71 under suction. Accordingly, the front side 2a of the semiconductor wafer 2 held on the chuck table 71 is oriented upward. Although the annular frame 5 supporting the dicing tape 6 is not shown in FIG. 7, the annular frame 5 is held by any suitable frame holding means provided on the chuck table 71.

The chuck table 71 thus holding the semiconductor wafer 2 is positioned directly below the imaging means 73 by the feeding means. When the chuck table 71 is positioned directly below the imaging means 73, an alignment operation is performed by the imaging means 73 and control means (not shown) to detect a cutting area where a kerf is to be formed along each street 21. More specifically, the imaging means 73 and the control means perform image processing such as pattern matching for making the alignment between some of the streets 21 extending in a predetermined first direction on the semiconductor wafer 2 and the cutting blade 721, thereby performing the alignment in the cutting area (alignment step). Similarly, the imaging means 73 and the control means perform the alignment in a cutting area for the other streets 21 extending in a second direction perpendicular to the first direction on the semiconductor wafer 2.

After performing such an alignment operation for detecting the cutting area of the semiconductor wafer 2 held on the chuck table 71, the chuck table 71 holding the semiconductor wafer 2 is moved to a cutting start position in the cutting area. At this cutting start position, one end (left end as viewed in FIG. 8A) of one of the streets 21 extending in the first direction is positioned on the right side of the cutting blade 721 by a predetermined amount. At this position, the cutting blade 721 is rotated at a predetermined rotational speed in the direction shown by an arrow 721a in FIG. 8A and simultaneously moved down from a standby position shown by a phantom line in FIG. 8A to a working position shown by a solid line in FIG. 8A by using in-feed means (not shown), thus performing an in-feed operation by a predetermined amount. This working position of the cutting blade 721 is set so that the outer circumference of the cutting blade 721 reaches the back side (lower surface as viewed in FIG. 8A) of the device area 23 on the back side 2b of the semiconductor wafer 2, i.e., the outer circumference of the cutting blade 721 reaches the front side (upper surface as viewed in FIG. 8A) of the dicing tape 6.

After performing the in-feed operation of the cutting blade 721, the chuck table 71 is moved at a predetermined feed speed in the direction shown by an arrow X1 in FIG. 8A as rotating the cutting blade 721 at the predetermined rotational speed in the direction shown by the arrow 721a. When the other end (right end as viewed in FIG. 8A) of this street 21 extending in the first direction has just passed through the position directly below the cutting blade 721, the movement of the chuck table 71 is stopped. As a result, a kerf 26 is formed along this street 21 on the front side 2a of the semiconductor wafer 2 as shown in FIG. 8B in such a manner that the kerf 26 has a depth corresponding to the thickness of the device area 23, i.e., reaching the back side of the device area 23 (lower surface as viewed in FIG. 8B) (kerf forming step).

Figure 9:
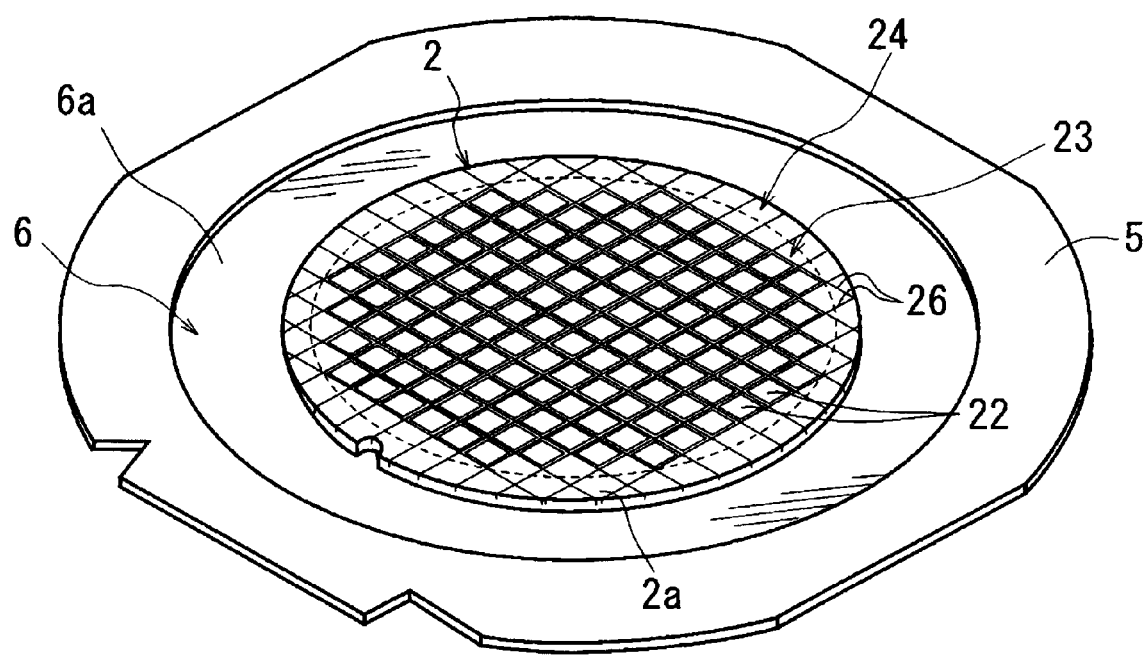
FIG. 9 is a perspective view of the semiconductor wafer obtained by performing the kerf forming step shown in FIGS. 8A and 8B.

After performing the kerf forming step along all of the streets 21 extending in the first direction, the chuck table 71 is rotated 90° to similarly perform the kerf forming step along all of the streets 21 extending in the second direction perpendicular to the first direction. As a result, the kerfs 26 are formed along all of the crossing streets 21 extending in the first and second directions on the front side 2a of the semiconductor wafer 2 as shown in FIG. 9 so that the depth of each kerf 26 reaches the back side of the device area 23. Therefore, the device area 23 is divided into the individual devices 22 by the kerfs 26. However, in the peripheral marginal area 24 surrounding the device area 23, the depth of each kerf 26 does not reach the back side of the annular reinforcing portion 24b, so that the annular shape of the peripheral marginal area 24 is maintained.

Figure 10A:
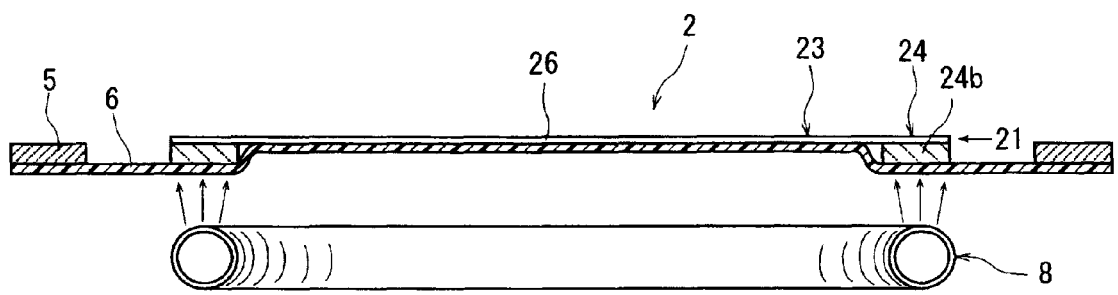
FIGS. 10A and 10B are sectional views for illustrating a peripheral marginal area removing step in the wafer processing method according to the present invention.
Figure 10B:
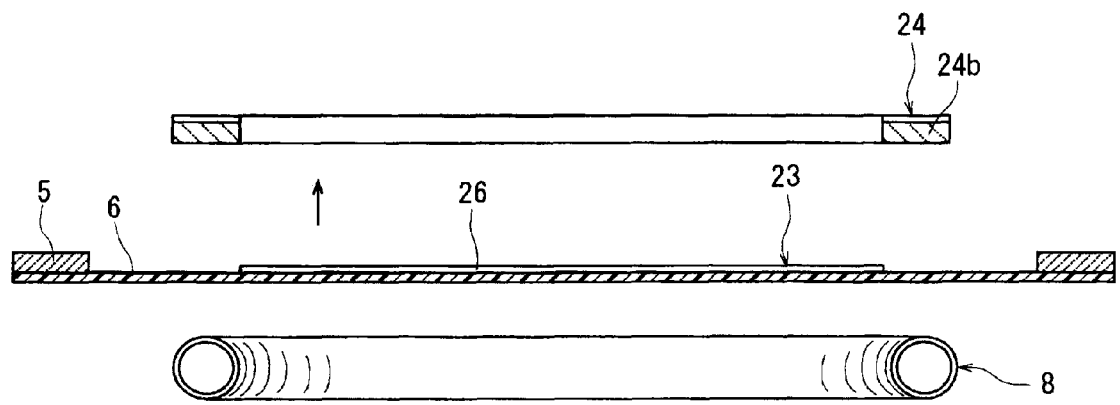

After performing the kerf forming step to divide the device area 23 of the semiconductor wafer 2 into the individual devices 22, a peripheral marginal area removing step is performed in such a manner that an external stimulus is applied to the dicing tape 6 in its attached area to the peripheral marginal area 24 where the annular reinforcing portion 24b is formed, thereby reducing the adhesive force of the dicing tape 6 in this attached area, and the peripheral marginal area 24 is next peeled off from the dicing tape 6. More specifically, as shown in FIG. 10A, ultraviolet radiation is applied from UV light applying means 8 to the back side (lower surface as viewed in FIG. 10A) of the dicing tape 6 in its attached area to the peripheral marginal area 24 where the annular reinforcing portion 24b is formed, wherein the back side 2b of the semiconductor wafer 2 is attached to the front side (upper surface) of the dicing tape 6 (ultraviolet radiation applying step).

As a result, the adhesive material in the attached area of the dicing tape 6 to the peripheral marginal area 24 is cured by the ultraviolet radiation to thereby reduce the adhesive force of the dicing tape 6 in the attached area to the peripheral marginal area 24 of the semiconductor wafer 2. After performing the ultraviolet radiation applying step, the peripheral marginal area 24 having the annular reinforcing portion 24b is peeled off from the dicing tape 6 (peripheral marginal area peeling step). That is, the adhesive force of the attached area of the dicing tape 6 to the peripheral marginal area 24 of the semiconductor wafer 2 is reduced by performing the ultraviolet radiation applying step mentioned above, so that the peripheral marginal area 24 can be easily peeled off from the dicing tape 6. In the case of using a tape whose adhesive force is reduced by heating as the dicing tape 6, the dicing tape 6 is heated at a predetermined temperature prior to performing the peripheral marginal area peeling step.

Figure 11:
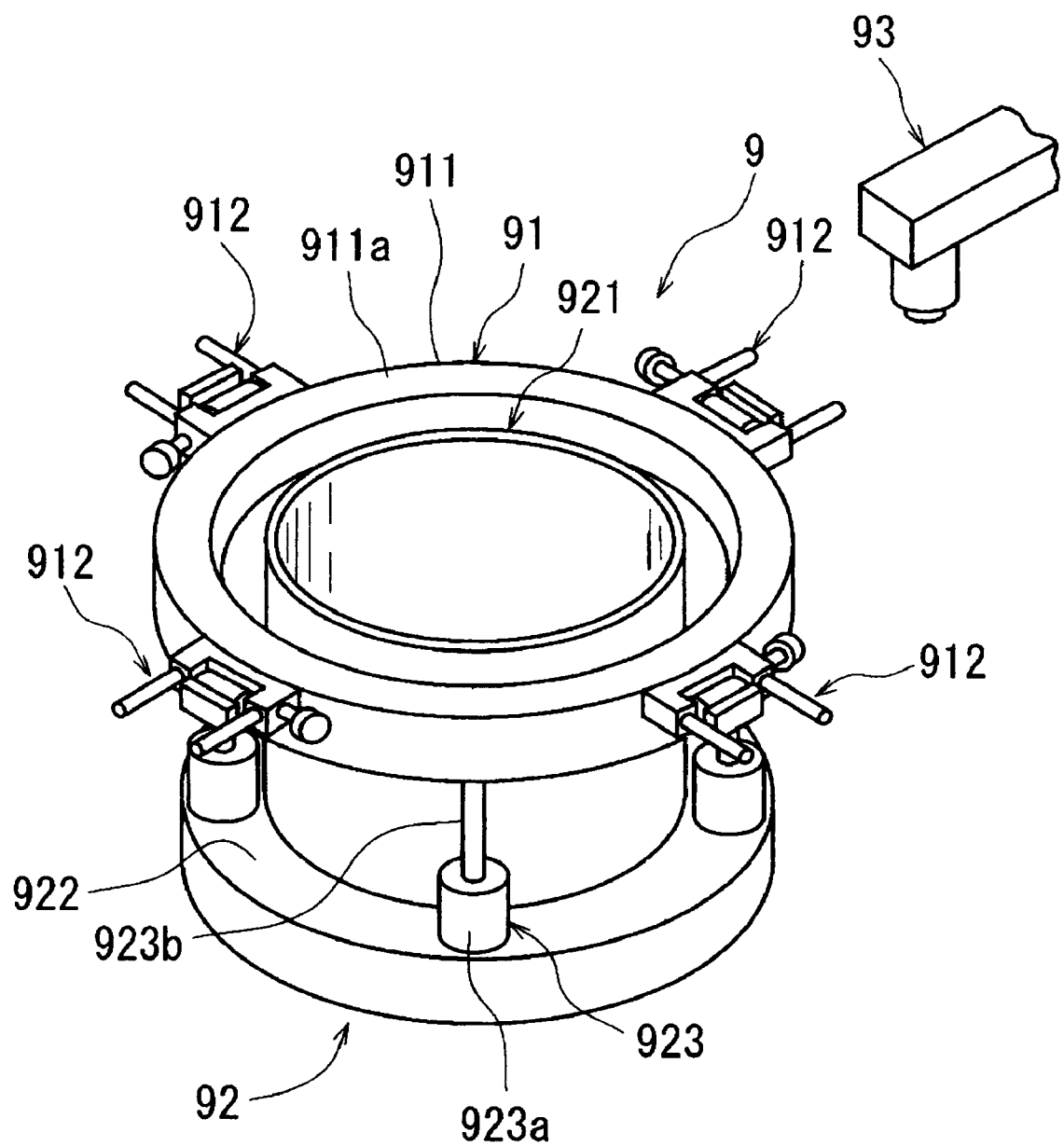
FIG. 11 is a perspective view of a pickup apparatus for performing a pickup step in the wafer processing method according to the present invention.

After performing the peripheral marginal area removing step, a pickup step is performed in such a manner that the individual devices 22 divided from each other and attached to the dicing tape 6 are peeled off from the dicing tape 6. This pickup step is performed by using a pickup apparatus 9 shown in FIG. 11. The pickup apparatus 9 shown in FIG. 11 includes frame holding means 91 for holding the annular frame 5, tape expanding means 92 for expanding the dicing tape 6 supported to the annular frame 5 held by the frame holding means 91, and a pickup collet 93 for picking up each device 22 from the dicing tape 6. The frame holding means 91 includes an annular frame holding member 911 and a plurality of clamps 912 as fixing means provided on the outer circumference of the frame holding member 911. The upper surface of the frame holding member 911 functions as a mounting surface 911a for mounting the annular frame 5 thereon. The annular frame 5 mounted on the mounting surface 911a is fixed to the frame holding member 911 by the clamps 912. The frame holding means 91 is supported by the tape expanding means 92 so as to be vertically movable.

Figure 12A:
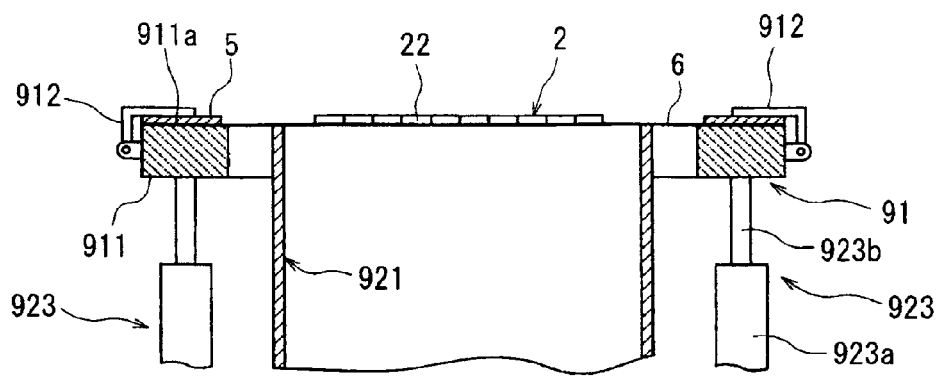
FIGS. 12A to 12C are sectional views for illustrating the pickup step in the wafer processing method according to the present invention.
Figure 12B:
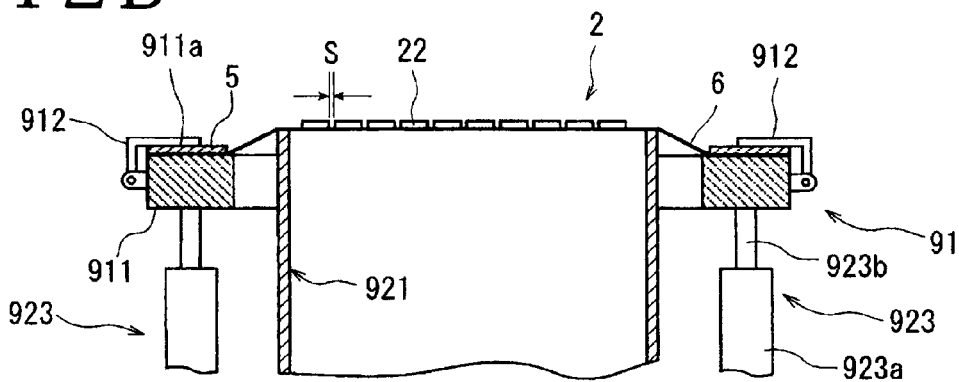

The tape expanding means 92 includes an expanding drum 921 provided inside of the annular frame holding member 911. The expanding drum 921 has an outer diameter smaller than the inner diameter of the annular frame 5 and an inner diameter larger than the outer diameter of the semiconductor wafer 2 attached to the dicing tape 6 supported to the annular frame 5. The expanding drum 921 has a supporting flange 922 at the lower end of the drum 921. The tape expanding means 92 further includes supporting means 923 for vertically moving the annular frame holding member 911. The supporting means 923 is composed of a plurality of air cylinders 923a provided on the supporting flange 922. Each air cylinder 923a is provided with a piston rod 923b connected to the lower surface of the annular frame holding member 911. The supporting means 923 composed of these plural air cylinders 923a functions to vertically move the annular frame holding member 911 so as to selectively take a reference position where the mounting surface 911a is substantially equal in height to the upper end of the expanding drum 921 as shown in FIG. 12A and an expansion position where the mounting surface 911a is lower in height than the upper end of the expanding drum 921 by a predetermined amount as shown in FIG. 12B.

The pickup step using the pickup apparatus 9 will now be described with reference to FIGS. 12A to 12C. As shown in FIG. 12A, the annular frame 5 supporting the semiconductor wafer 2 through the dicing tape 6 (the semiconductor wafer 2 being divided into the individual devices 22 along the streets 21) is mounted on the mounting surface 911a of the frame holding member 911 of the frame holding means 91 and fixed to the frame holding member 911 by the clamps 912. At this time, the frame holding member 911 is set at the reference position shown in FIG. 12A. Thereafter, the air cylinders 923a as the supporting means 923 of the tape expanding means 92 are operated to lower the frame holding member 911 to the expansion position shown in FIG. 12B. Accordingly, the annular frame 5 fixed to the mounting surface 911a of the frame holding member 911 is also lowered, so that the dicing tape 6 supported to the annular frame 5 comes into abutment against the upper end of the expanding drum 921 and is expanded as shown in FIG. 12B. As a result, the spacing S between any adjacent ones of the individual devices 22 attached to the dicing tape 6 is increased as shown in FIG. 12B.

Figure 12C:
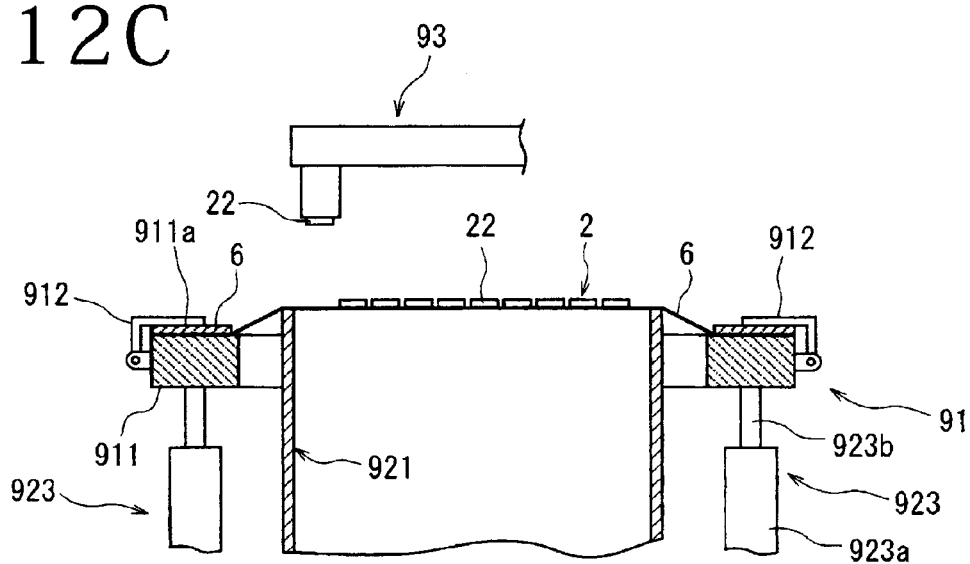

Thereafter, as shown in FIG. 12C, the pickup collet 93 is operated to hold each device 22 under suction and peel it off from the dicing tape 6. Each device 22 thus picked up by the pickup collet 93 is transported to a tray (not shown). In this pickup step, the spacing S between any adjacent ones of the individual devices 22 is increased, so that each device 22 can be easily picked up without the contact with its adjacent device 22. Prior to peeling off each device 22 from the dicing tape 6, ultraviolet radiation may be applied to the dicing tape 6 to thereby reduce the adhesive force of the dicing tape 6. Accordingly, in this case, each device 22 can be peeled off from the dicing tape 6 more easily.

A second preferred embodiment of the wafer processing method according to the present invention will now be described. In the second preferred embodiment of the present invention, the protective member attaching step shown in FIG. 2 is first performed to attach the protective member 3 to the front side 2a of the semiconductor wafer 2. Thereafter, the back grinding step shown in FIGS. 3 to 5 is performed, and the wafer supporting step shown in FIGS. 6A and 6B is next performed.

Figure 13:
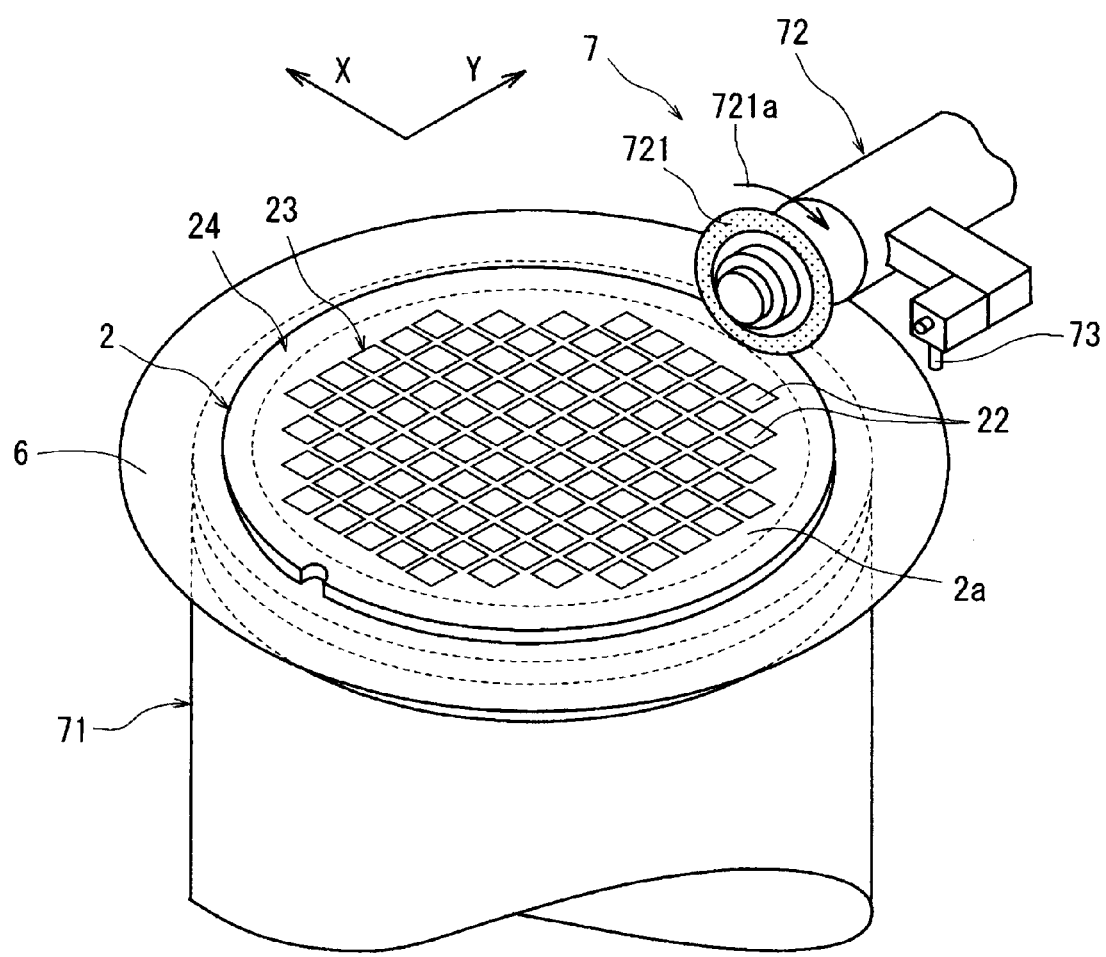
FIG. 13 is a perspective view of a cutting apparatus for performing a peripheral marginal area separating step in the wafer processing method according to the present invention.

After performing the wafer supporting step shown in FIGS. 6A and 6B, a peripheral marginal area separating step is performed in such a manner that the semiconductor wafer 2 attached to the dicing tape 6 is cut along the boundary between the device area 23 and the peripheral marginal area 24. This peripheral marginal area separating step may be performed by using the cutting apparatus 7 shown in FIG. 7. The peripheral marginal area separating step using the cutting apparatus 7 is performed in the following manner. As shown in FIG. 13, the semiconductor wafer 2 is placed on the chuck table 71 in the condition where the dicing tape 6 to which the back side 2b of the semiconductor wafer 2 is attached comes into contact with the upper surface of the chuck table 71. By operating the suction means, the semiconductor wafer 2 is held on the chuck table 71 under suction. Accordingly, the front side 2a of the semiconductor wafer 2 held on the chuck table 71 is oriented upward. Although the annular frame 5 supporting the dicing tape 6 is not shown in FIG. 13, the annular frame 5 is held by any suitable frame holding means provided on the chuck table 71.

The chuck table 71 thus holding the semiconductor wafer 2 is positioned directly below the imaging means 73 as shown in FIG. 13. Thereafter, an alignment step is performed by the imaging means 73 and the control means to detect a cutting area where a circular slit is to be formed along the boundary between the device area 23 and the peripheral marginal area 24 of the semiconductor wafer 2. More specifically, the imaging means 73 and the control means perform an alignment operation for making the alignment between the boundary between the device area 23 and the peripheral marginal area 24 of the semiconductor wafer 2 (i.e., this boundary corresponding to the inner circumference of the annular reinforcing portion 24b) and the cutting blade 721.

After performing such an alignment operation for detecting the cutting area of the semiconductor wafer 2 held on the chuck table 71, the chuck table 71 holding the semiconductor wafer 2 is moved to the cutting area. Further, the cutting blade 721 of the cutting means 72 is positioned directly above the boundary between the device area 23 and the peripheral marginal area 24 of the semiconductor wafer 2 held on the chuck table 71. At this position, the cutting blade 721 is rotated in the direction shown by an arrow 721a in FIG. 14A and simultaneously moved down from a standby position shown by a phantom line in FIG. 14A to a working position shown by a solid line in FIG. 14A. This working position is set so that the outer circumference of the cutting blade 721 reaches the dicing tape 6.

Figure 14A:
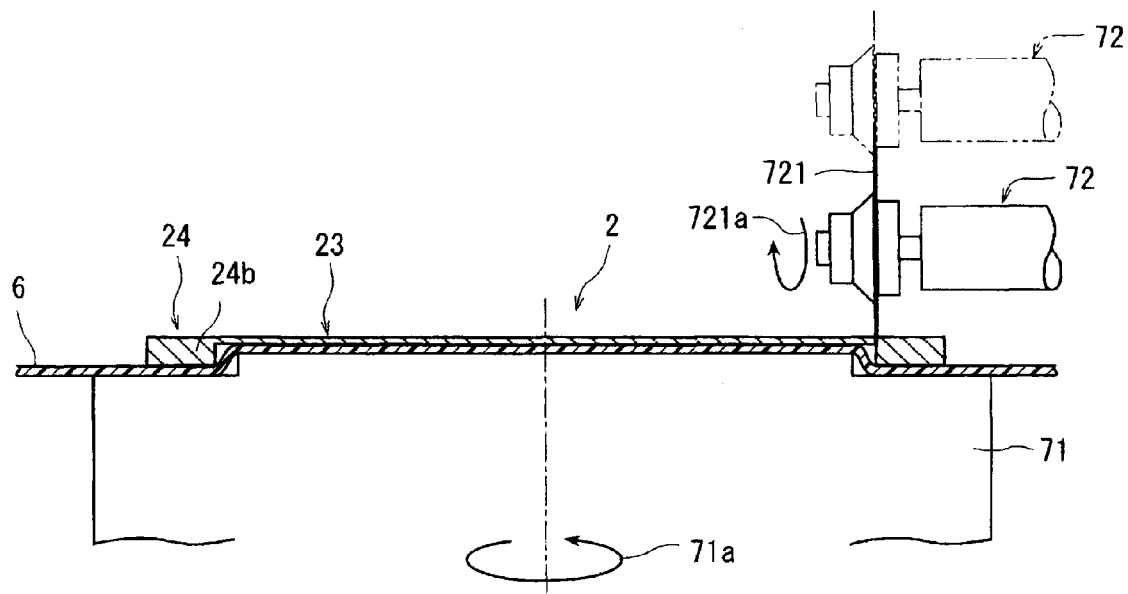
FIGS. 14A and 14B are sectional views for illustrating the peripheral marginal area separating step in the wafer processing method according to the present invention.
Figure 14B:
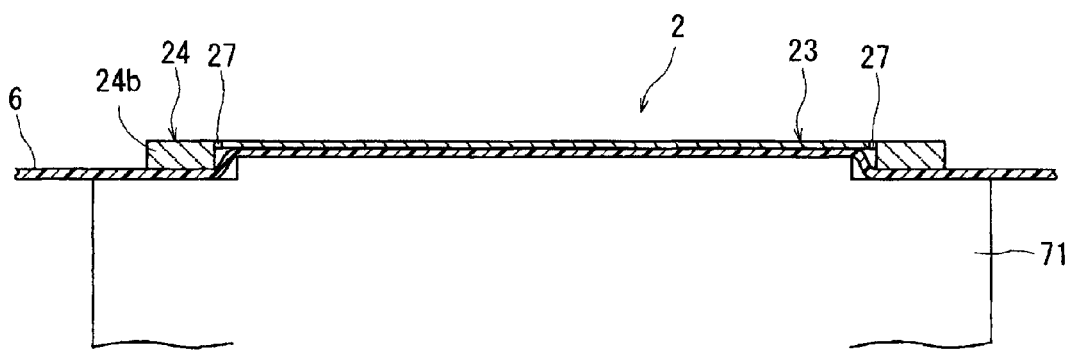

Thereafter, the chuck table 71 is rotated 360° in the direction shown by an arrow 71a in FIG. 14A as rotating the cutting blade 721 in the direction shown by the arrow 721a. As a result, a circular slit 27 is formed along the boundary between the device area 23 and the peripheral marginal area 24 as shown in FIG. 14B. That is, the semiconductor wafer 2 held on the chuck table 71 is cut into the device area 23 and the peripheral marginal area 24 along the circular slit 27 (peripheral marginal area separating step).

Figure 15A:
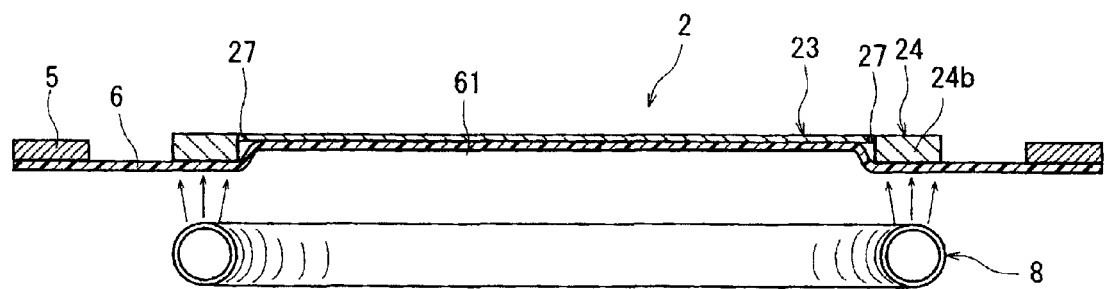
FIGS. 15A and 15B are sectional views for illustrating another preferred embodiment of the peripheral marginal area removing step in the wafer processing method according to the present invention.
Figure 15B:
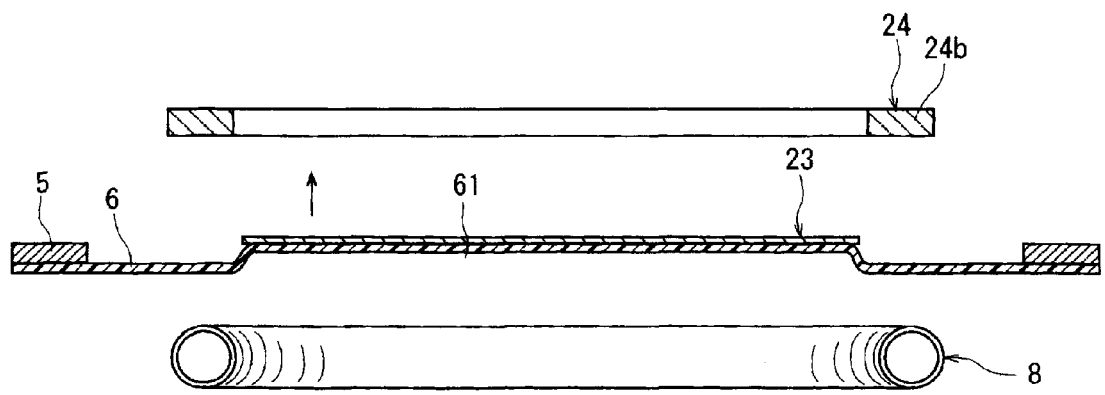

After performing the peripheral marginal area separating step, a peripheral marginal area removing step is performed in such a manner that an external stimulus is applied to the dicing tape 6 in its attached area to the peripheral marginal area 24 where the annular reinforcing portion 24b is formed, thereby reducing the adhesive force of the dicing tape 6 in this attached area, and the peripheral marginal area 24 is next peeled off from the dicing tape 6. More specifically, as shown in FIG. 15A, ultraviolet radiation is applied from UV light applying means 8 to the back side (lower side as viewed in FIG. 15A) of the dicing tape 6 in its attached area to the peripheral marginal area 24 where the annular reinforcing portion 24b is formed, wherein the back side 2b of the semiconductor wafer 2 is attached to the front side (upper surface) of the dicing tape 6 (ultraviolet radiation applying step). As a result, the adhesive material in the attached area of the dicing tape 6 to the peripheral marginal area 24 is cured by the ultraviolet radiation to thereby reduce the adhesive force of the dicing tape 6 in the attached area to the peripheral marginal area 24 of the semiconductor wafer 2.

After performing the ultraviolet radiation applying step, the peripheral marginal area 24 having the annular reinforcing portion 24b is peeled off from the dicing tape 6 (peripheral marginal area peeling step). That is, the adhesive force of the attached area of the dicing tape 6 to the peripheral marginal area 24 of the semiconductor wafer 2 is reduced by performing the ultraviolet radiation applying step mentioned above, so that the peripheral marginal area 24 can be easily peeled off from the dicing tape 6. In the case of using a tape whose adhesive force is reduced by heating as the dicing tape 6, the dicing tape 6 is heated at a predetermined temperature prior to performing the peripheral marginal area peeling step.

Figure 16:
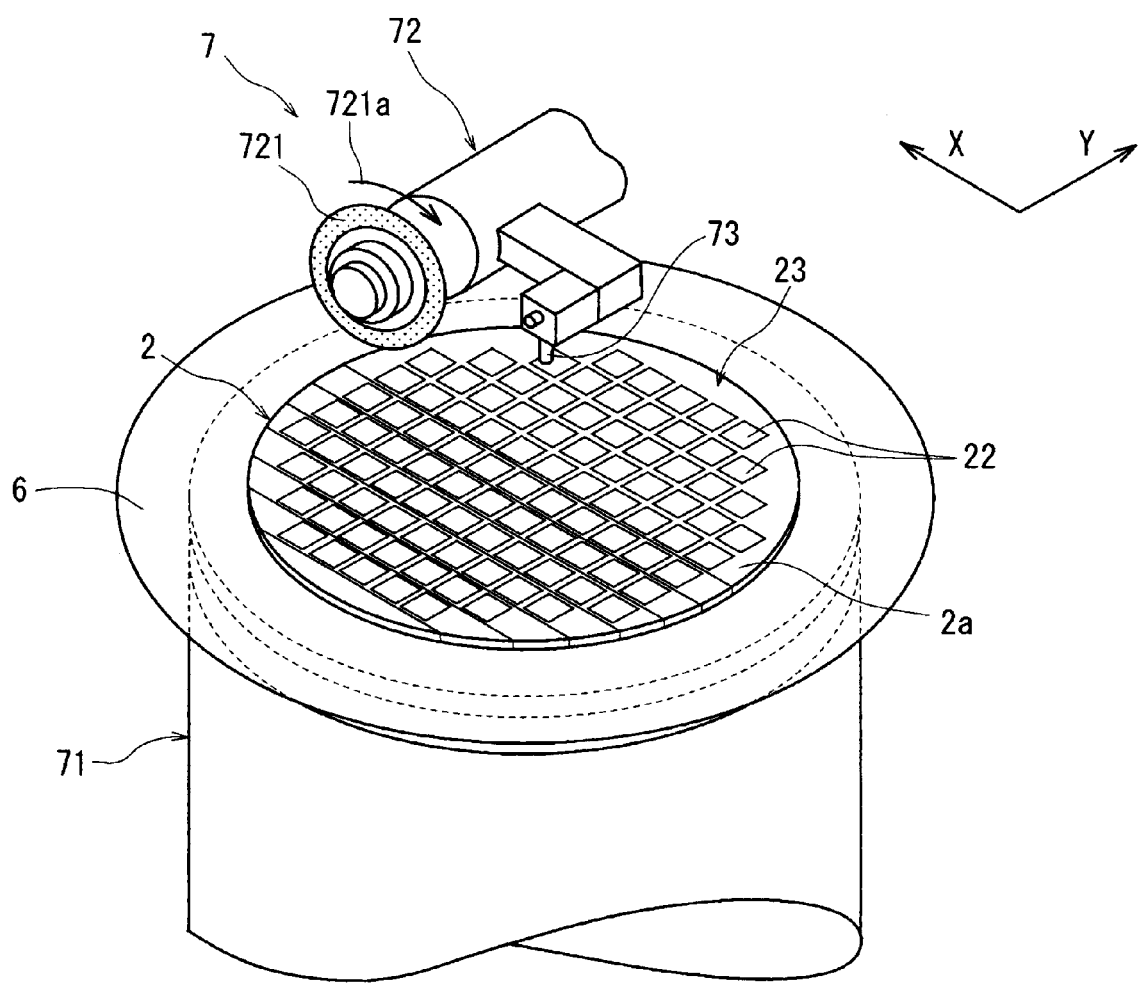
FIG. 16 is a perspective view of a cutting apparatus for performing another preferred embodiment of the kerf forming step in the wafer processing method according to the present invention.

After performing the peripheral marginal area removing step to remove the peripheral marginal area 24 of the semiconductor wafer 2 from the dicing tape 6, a kerf forming step is performed in such a manner that the front side 2a of the semiconductor wafer 2 (the front side of the device area 23) is cut along each street 21 by using a cutting blade to thereby form a kerf having a depth corresponding to the thickness of the device area 23. This kerf forming step may be performed by using the cutting apparatus 7 shown in FIG. 7. The kerf forming step using the cutting apparatus 7 is performed in the following manner. As shown in FIG. 16, the device area 23 of the semiconductor wafer 2 is placed on the chuck table 71 in the condition where the dicing tape 6 to which the back side of the device area 23 is attached comes into contact with the upper surface of the chuck table 71. By operating the suction means, the device area 23 of the semiconductor wafer 2 is held on the chuck table 71 under suction. Accordingly, the front side of the device area 23 of the semiconductor wafer 2 held on the chuck table 71 is oriented upward. Although the annular frame 5 supporting the dicing tape 6 is not shown in FIG. 16, the annular frame 5 is held by any suitable frame holding means provided on the chuck table 71.

The chuck table 71 thus holding the semiconductor wafer 2 is positioned directly below the imaging means 73 by the feeding means. When the chuck table 71 is positioned directly below the imaging means 73, an alignment operation is performed by the imaging means 73 and the control means to detect a cutting area where a kerf is to be formed in the device area 23 of the semiconductor wafer 2. More specifically, the imaging means 73 and the control means perform image processing such as pattern matching for making the alignment between some of the streets 21 extending in a predetermined first direction on the device area 23 of the semiconductor wafer 2 and the cutting blade 721, thereby performing the alignment in the cutting area (alignment step). Similarly, the imaging means 73 and the control means perform the alignment in a cutting area for the other streets 21 extending in a second direction perpendicular to the first direction on the device area 23 of the semiconductor wafer 2.

After performing such an alignment operation for detecting the cutting area in the device area 23 of the semiconductor wafer 2 held on the chuck table 71, the chuck table 71 holding the device area 23 of the semiconductor wafer 2 is moved to a cutting start position in the cutting area. At this cutting start position, one end (left end as viewed in FIG. 17A) of one of the streets 21 extending in the first direction is positioned on the right side of the cutting blade 721 by a predetermined amount. At this position, the cutting blade 721 is rotated at a predetermined rotational speed in the direction shown by an arrow 721a in FIG. 17A and simultaneously moved down from a standby position shown by a phantom line in FIG. 17A to a working position shown by a solid line in FIG. 17A by using the in-feed means, thus performing an in-feed operation by a predetermined amount. This working position of the cutting blade 721 is set so that the outer circumference of the cutting blade 721 reaches the back side (lower surface as viewed in FIG. 17A) of the device area 23 of the semiconductor wafer 2.

Figure 17A:
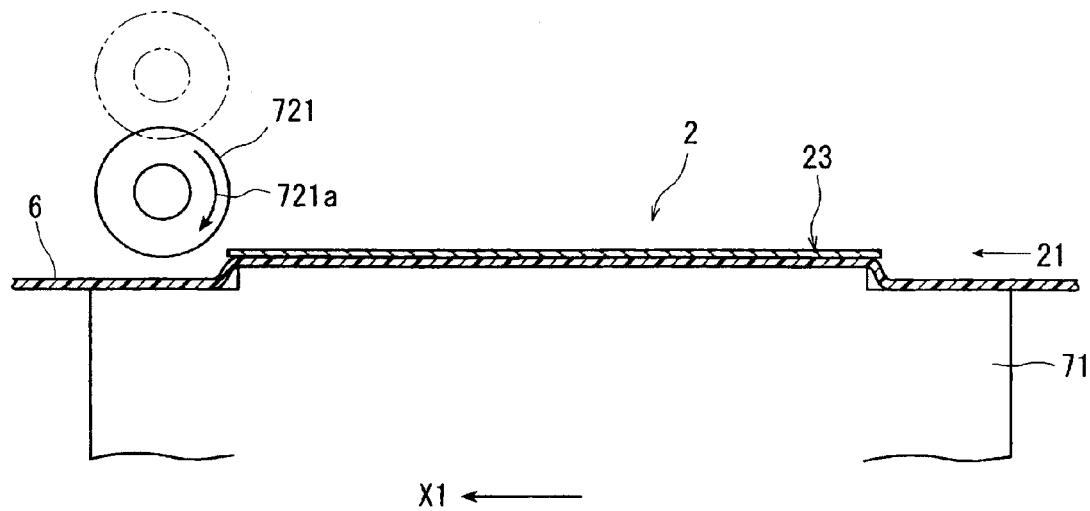
FIGS. 17A and 17B are sectional views for illustrating the kerf forming step shown in FIG. 16.
Figure 17B:
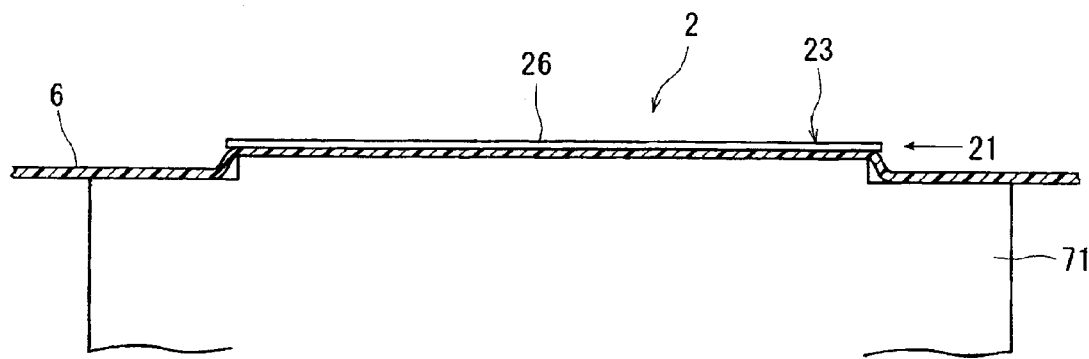

After performing the in-feed operation of the cutting blade 721, the chuck table 71 is moved at a predetermined feed speed in the direction shown by an arrow X1 in FIG. 17A as rotating the cutting blade 721 at the predetermined rotational speed in the direction shown by the arrow 721a. When the other end (right end as viewed in FIG. 17A) of this street 21 extending in the first direction has just passed through the position directly below the cutting blade 721, the movement of the chuck table 71 is stopped. As a result, a kerf 26 is formed along this street 21 in the device area 23 of the semiconductor wafer 2 as shown in FIG. 17B in such a manner that the kerf 26 has a depth corresponding to the thickness of the device area 23 (kerf forming step).

Figure 18:
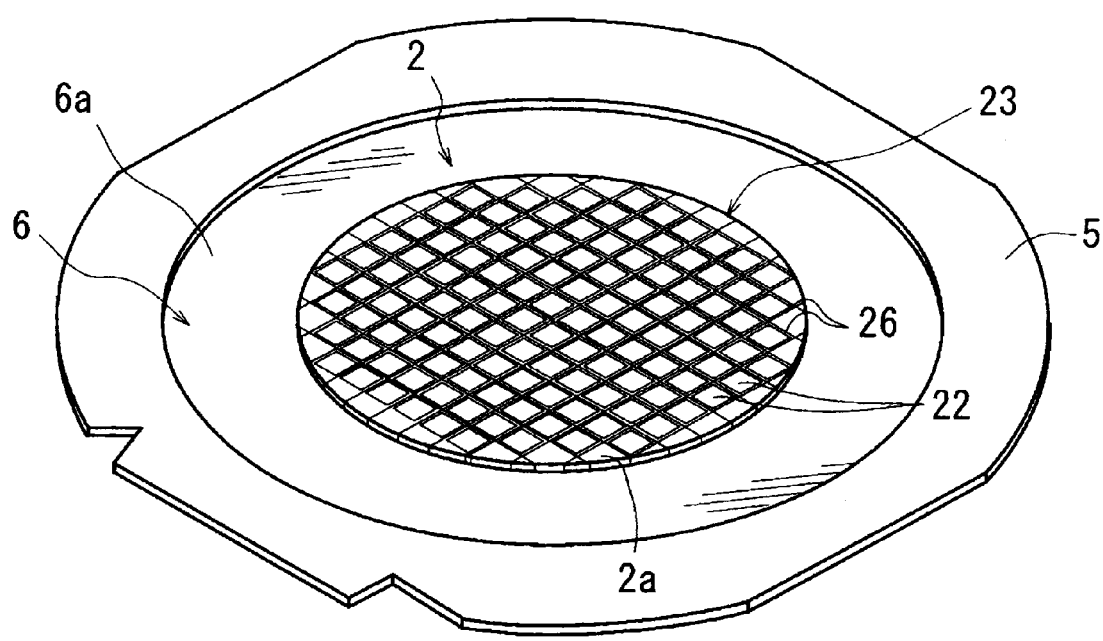
FIG. 18 is a perspective view of the semiconductor wafer obtained by performing the kerf forming step shown in FIGS. 17A and 17B.

After performing the kerf forming step along all of the streets 21 extending in the first direction, the chuck table 71 is rotated 90° to similarly perform the kerf forming step along all of the streets 21 extending in the second direction perpendicular to the first direction. As a result, the kerfs 26 are formed along all of the crossing streets 21 extending in the first and second directions on the front side of the device area 23 of the semiconductor wafer 2 as shown in FIG. 18 so that the depth of each kerf 26 reaches the back side of the device area 23. Therefore, the device area 23 is divided into the individual devices 22 by the kerfs 26.

After performing the kerf forming step, a pickup step is performed in such a manner that the individual devices 22 divided from each other and attached to the dicing tape 6 are peeled off from the dicing tape 6. This pickup step is performed as shown in FIGS. 12A to 12C by using the pickup apparatus 9 shown in FIG. 11.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer along a plurality of crossing streets formed on the front side of said wafer, said wafer having a device area and a peripheral marginal area surrounding said device area, said device area being composed of a plurality of regions partitioned by said streets, wherein individual devices are respectively formed in said regions of said device area, said wafer processing method comprising:

a back grinding step of grinding the back side of said wafer in an area corresponding to said device area to thereby reduce the thickness of said device area to a predetermined finished thickness and to simultaneously form an annular reinforcing portion on the back side of said wafer in an area corresponding to said peripheral marginal area;

a wafer supporting step of attaching the back side of said wafer to a dicing tape supported to an annular frame after performing said back grinding step, wherein the adhesive force of said dicing tape can be reduced by an external stimulus;

a kerf forming step of cutting the front side of said wafer attached to said dicing tape along each street by using a cutting blade after performing said wafer supporting step, thereby forming a kerf having a depth corresponding to the thickness of said device area along each street to thereby divide said device area into said individual devices; and a peripheral marginal area removing step of applying said external stimulus to said dicing tape at which attached said peripheral marginal area where said annular reinforcing portion is formed after performing said kerf forming step, thereby reducing the adhesive force of said dicing tape, and next peeling off said peripheral marginal area from said dicing tape.

2. The wafer processing method according to claim 1, further comprising a pickup step of expanding said dicing tape after performing said peripheral marginal area removing step to thereby increase the spacing between any adjacent ones of said individual devices divided from each other and attached to said dicing tape, and next peeling off each device from said dicing tape.

3. A wafer processing method for dividing a wafer along a plurality of crossing streets formed on the front side of said wafer, said wafer having a device area and a peripheral marginal area surrounding said device area, said device area being composed of a plurality of regions partitioned by said streets, wherein individual devices are respectively formed in said regions of said device area, said wafer processing method comprising:

a back grinding step of grinding the back side of said wafer in an area corresponding to said device area to thereby reduce the thickness of said device area to a predetermined finished thickness and to simultaneously form an annular reinforcing portion on the back side of said wafer in an area corresponding to said peripheral marginal area;

a wafer supporting step of attaching the back side of said wafer to a dicing tape supported to an annular frame after performing said back grinding step, wherein the adhesive force of said dicing tape can be reduced by an external stimulus;

a peripheral marginal area separating step of cutting said wafer attached to said dicing tape along the boundary between said device area and said peripheral marginal area after performing said wafer supporting step;

a peripheral marginal area removing step of applying said external stimulus to said dicing tape at which attached said peripheral marginal area where an annular reinforcing portion is formed after performing said peripheral marginal area separating step, thereby reducing the adhesive force of said dicing tape, and next peeling off said peripheral marginal area from said dicing tape; and a kerf forming step of cutting the front side of said device area of said wafer along each street by using a cutting blade after performing said peripheral marginal area removing step, thereby forming a kerf having a depth corresponding to the thickness of said device area along each street to thereby divide said device area into said individual devices.

4. The wafer processing method according to claim 3, further comprising a pickup step of expanding said dicing tape after performing said kerf forming step to thereby increase the spacing between any adjacent ones of said individual devices divided from each other and attached to said dicing tape, and next peeling off each device from said dicing tape.

* * * * *